(12) United States Patent
Liu et al.

(10) Patent No.: US 11,854,290 B2
(45) Date of Patent: Dec. 26, 2023

(54) DISPLAY SUBSTRATE AND DISPLAY DEVICE

(71) Applicant: BOE TECHNOLOGY GROUP CO., LTD., Beijing (CN)

(72) Inventors: Hao Liu, Beijing (CN); Yueping Zuo, Beijing (CN); Huijuan Zhang, Beijing (CN); Ming Liu, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 153 days.

(21) Appl. No.: 17/425,482

(22) PCT Filed: Sep. 18, 2020

(86) PCT No.: PCT/CN2020/116132
§ 371 (c)(1),
(2) Date: Jul. 23, 2021

(87) PCT Pub. No.: WO2022/056815
PCT Pub. Date: Mar. 24, 2022

(65) Prior Publication Data
US 2022/0319222 A1    Oct. 6, 2022

(51) Int. Cl.
*G06K 9/28* (2006.01)
*G06V 40/13* (2022.01)
*G11C 19/28* (2006.01)
*H10K 59/131* (2023.01)
*H10K 59/122* (2023.01)

(52) U.S. Cl.
CPC ........ *G06V 40/1306* (2022.01); *G11C 19/287* (2013.01); *H10K 59/131* (2023.02); *H10K 59/122* (2023.02)

(58) Field of Classification Search
CPC .......... G06V 40/1306; G06V 40/12–40/1394; H10K 59/10–59/221
See application file for complete search history.

(56) References Cited

U.S. PATENT DOCUMENTS

| | | | |
|---|---|---|---|
| 2017/0083738 A1 | 3/2017 | Park et al. | |
| 2018/0130857 A1* | 5/2018 | Lee | H10K 50/844 |
| 2020/0321405 A1 | 10/2020 | Kang et al. | |

FOREIGN PATENT DOCUMENTS

| | | |
|---|---|---|
| CN | 105139793 A | 12/2015 |
| CN | 105678258 A | 6/2016 |
| CN | 106409224 A | 2/2017 |
| CN | 109309109 A | 2/2019 |
| CN | 110008936 A | 7/2019 |

* cited by examiner

*Primary Examiner* — Brian Werner
(74) *Attorney, Agent, or Firm* — HOUTTEMAN LAW LLC

(57) ABSTRACT

The present disclosure provides a display substrate and a display device, and belongs to the field of display technology. The display substrate of the present disclosure includes: a base substrate having a display region; a plurality of fingerprint identification circuits in the display region of the base substrate, wherein each fingerprint identification circuit includes a control sub-circuit and a detection electrode; wherein in a fingerprint identification phase, the control sub-circuit is configured to read a capacitance between the detection electrode and a valley and a ridge of a fingerprint in response to a fingerprint scanning signal, so as to perform fingerprint identification.

19 Claims, 7 Drawing Sheets

DISPLAY SUBSTRATE AND DISPLAY DEVICE

TECHNICAL FIELD

The present disclosure relates to the field of display technology, and in particular to a display substrate and a display device.

BACKGROUND

Fingerprints of a person are invariant features that are inherent, unique and distinguishable from other person. Fingerprints are composed of a series of ridges and valleys on a skin surface at a tip of a finger. The constituent details of these ridges and valleys typically include bifurcation of a ridge, an end of the ridge, an arch, a tent-like arch, a left-handed rotation, a right-handed rotation, a spiral, or a birotation, which decides the uniqueness of a fingerprint pattern for each person. The fingerprint identification technology developed based on this is earlier used as a technology for personal identity verification. According to different ways for fingerprint collection and input, the technology, which is widely applied at present and is well known, includes: optical imaging, heat-sensitive sensors, human body infrared sensors, and the like.

SUMMARY

The present disclosure intends to at least solve one of the problems existed in the prior art, and thus, provides a display substrate and a display device.

The technical solution for solving the technical problem of the present disclosure is to provide a display substrate, including:
- a base substrate having a display region;
- a plurality of fingerprint identification circuits in the display region of the base substrate, wherein each fingerprint identification circuit includes a control sub-circuit and a detection electrode; wherein,
- in a fingerprint identification phase, the control sub-circuit is configured to read a capacitance between the detection electrode and a valley and a ridge of a fingerprint, in response to a fingerprint scanning signal, so as to perform fingerprint identification.

The display substrate further includes:
- a plurality of pixel circuits in the display region of the base substrate, wherein each of the plurality of pixel circuits includes a pixel driving sub-circuit and a light-emitting device; wherein,
- the pixel driving sub-circuit is configured to control the light-emitting device to emit light according to a data voltage signal, in response to a gate scanning signal.

Wherein the light-emitting device is a bottom emission type light-emitting device, and the detection electrode is on a side of the control sub-circuit proximal to the base substrate.

Wherein the pixel driving sub-circuit and the control sub-circuit each include a thin film transistor; the thin film transistor is a top gate thin film transistor;
- a light-shielding layer is on a side of the thin film transistor proximal to the base substrate, and an orthographic projection of the light-shielding layer on the base substrate covers an orthographic projection of an active layer of the thin film transistor on the base substrate;
- the detection electrode and the light-shielding layer are in a same layer and are made of the same material.

Wherein the light-emitting device is a top emission type light-emitting device, and the detection electrode is on a side of the control sub-circuit distal to the base substrate.

Wherein the detection electrode and a cathode of the light-emitting device are in a same layer and are made of the same material.

Wherein the thin film transistors in the control sub-circuit include at least: a read switch transistor and an initialization switch transistor;
- a control electrode of the read switch transistor is connected to a fingerprint scanning signal line, a first electrode of the read switch transistor is connected to the sensing signal line, and a second electrode of the read switch transistor is connected to the detection electrode;
- a control electrode of the initialization switch transistor is connected to an initialization control signal line, a first electrode of the initialization switch transistor is connected to the driving signal line, and a second electrode of the initialization switch transistor is connected to the detection electrode.

Wherein the pixel driving sub-circuit includes a driving transistor and a storage capacitor; a control electrode of the driving transistor is used as a first plate of the storage capacitor; a second plate of the storage capacitor is on a side of the first plate distal to the base substrate; a second gate insulating layer is between the second plate and the first plate; a first gate insulating layer is between the control electrode and the active layer of the driving transistor; each layer of the driving transistor and corresponding layer of the read switch transistor are in a same layer and are made of the same material;
- a buffer layer is between a layer where an active layer of the read switch transistor is located and a layer where the detection electrode is located; a transition electrode is also provided in a layer where the second plate is located, and is made of the same material as the second plate;
- a second electrode of the read switch transistor is connected to the transition electrode through a via extending through the interlayer insulating layer; the transition electrode is connected to the detection electrode through a via extending through the first gate insulating layer, the second gate insulating layer and the buffer layer.

The plurality of fingerprint identification circuits are in an array, and control electrodes of read switch transistors in the fingerprint identification circuits in a same row are connected to a same fingerprint scanning line; control electrodes of initialization switch transistors in the fingerprint identification circuits in a same row are connected to a same initialization control signal line; the display substrate further includes:
- a first gate driving circuit on the base substrate; wherein the first gate driving circuit includes: a plurality of cascaded first shift register units; the first shift register units are connected to the fingerprint scanning signal lines in a one-to-one correspondence;
- a signal output terminal of an Nth first shift register unit is connected to an Nth fingerprint scanning signal line and an (N+1)th initialization control signal line; N≥1.

The plurality of pixel circuits are arranged in an array, and the pixel circuits and the fingerprint identification circuits are alternately in a row direction or a column direction.

The plurality of fingerprint identification circuits are arranged in an array, and first electrodes of read switch transistors in the fingerprint identification circuits in a same column are connected to a same sensing signal line; and first electrodes of initialization switch transistors in the fingerprint identification circuits in a same row are connected to a same driving signal line.

In a second aspect, an embodiment of the present disclosure provides a display device, which includes the above display substrate.

DETAIL DESCRIPTION OF EMBODIMENTS

To enable one of ordinary skill in the art to better understand technical solutions of the present disclosure, the present disclosure will be further described in detail below with reference to the accompanying drawings and exemplary embodiments.

Unless defined otherwise, technical or scientific terms used herein should have the ordinary meaning as understood by one of ordinary skill in the art to which the present disclosure belongs. The terms of "first", "second", and the like used in the present disclosure are not intended to indicate any order, quantity, or importance, but rather are used for distinguishing one element from another. Further, the terms "a", "an", "the", or the like do not denote a limitation of quantity, but rather denote the presence of at least one element. The term of "comprising", "including", or the like, means that the element or item preceding the term contains the element or item listed after the term and its equivalent, but does not exclude the presence of other elements or items. The term "connected", "coupled", or the like is not limited to physical or mechanical connections, but may include electrical connections, whether direct or indirect connections. The terms "upper", "lower", "left", "right", and the like are used merely for indicating relative positional relationships, and when the absolute position of the object being described is changed, the relative positional relationships may also be changed accordingly.

It should be noted that transistors used in the embodiments of the present disclosure may be thin film transistors or field effect transistors or other devices with the same characteristics. Since a source and a drain of the transistor used are symmetrical, there is no difference between the source and the drain. In the embodiments of the present disclosure, to distinguish the source and the drain of the transistor, one of the source and the drain is referred to as a first electrode, the other is referred to as a second electrode, and a gate is referred to as a control electrode. In addition, the transistor may be divided into an N-type transistor and a P-type transistor according to the characteristics of the transistors. In the following embodiments, description will be made by taking an example in which the transistor is an N-type transistor. When the N-type transistor is used, the first electrode is the source of the N-type transistor, and the second electrode is the drain of the N-type transistor. When a high-level is input to the gate, the source and the drain are conducted, while the P-type transistor has an opposite case. It is contemplated that the implementation with P-type transistors will be easily conceived by one of ordinary skill in the art without any creative work, and thus, is within a scope of the embodiments of the present disclosure.

Figure 1:
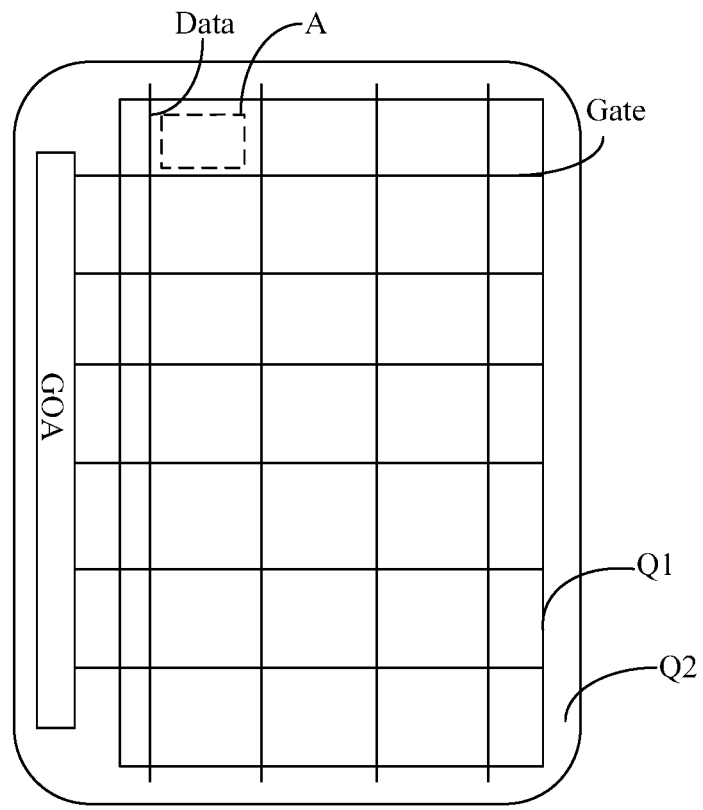
FIG. 1 shows an exemplary display substrate.

FIG. 1 illustrates an exemplary display substrate. As shown in FIG. 1, the display substrate has a display region Q1 and a peripheral region Q2 surrounding the display region Q1. The display substrate includes a base substrate on which a plurality of gate lines Gate and a plurality of data lines Data are provided, wherein each gate line Gate and each data line Data cross with each other, thereby defining a plurality of pixel units located in the display region Q1. The structure of the display substrate will be described by taking an example in which an extending direction of each gate line Gate is as a row direction and an extending direction of each data line Data is as a column direction. Each pixel unit is provided with a pixel circuit, and the pixel circuit includes a pixel driving sub-circuit and a light-emitting device. When a display panel is driven to display, according to a picture to be displayed, a gate scanning signal may be written into the gate lines Gate row by row, while a data voltage signal may be written into the data lines Data, so that the light-emitting devices in the pixel units in the display panel are lightened row by row.

The gate scanning signal is provided by a gate driving circuit, and the data voltage signal is provided by a source driving circuit; in the related art, the gate driving circuit may be integrated in a gate driving chip, and the source driving circuit may be integrated in a source driving chip. At present, in order to reduce the number of chips and realize a narrow frame or no frames, however, a technology for integrating the gate driving circuit on an array substrate (Gate On Array; GOA) is provided; wherein the gate driving circuit includes a plurality of cascaded shift register units on the peripheral region Q2 of the integrated display substrate, and each shift register unit is connected with the gate lines Gate in a one-to-one correspondence, and is configured to provide gate scanning signals to the gate line Gate connected with the shift register unit.

Figure 2:
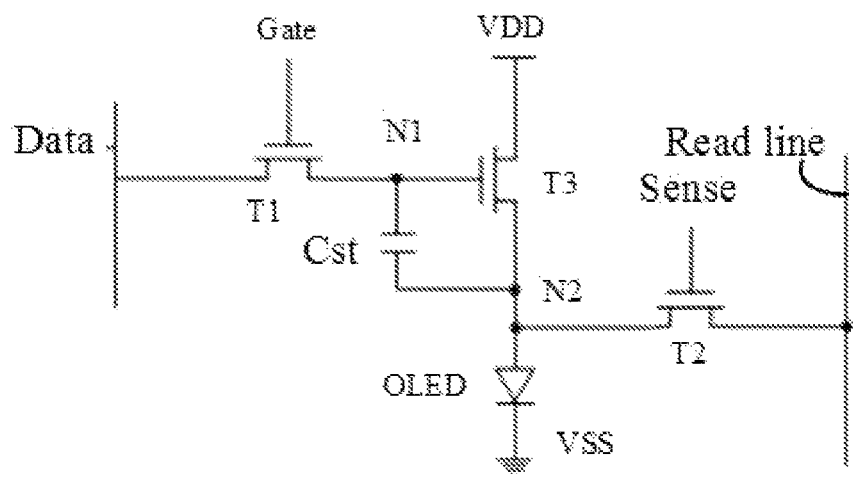
FIG. 2 shows an exemplary pixel circuit.
Figure 3:
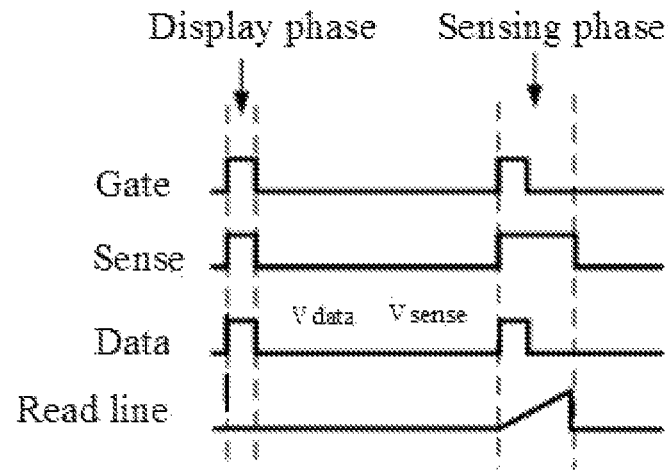
FIG. 3 illustrates a timing diagram of operation of the pixel circuit of FIG. 2.

FIG. 2 illustrates an exemplary pixel circuit; FIG. 3 illustrates a timing diagram of operation of the pixel circuit of FIG. 2. As shown in FIGS. 2 and 3, the pixel driving sub-circuit in the pixel circuit includes a display switch transistor T1, a sensing switch transistor T2, a driving transistor T3, and a storage capacitor Cst. The light-emitting device is an organic light-emitting diode (OLED); wherein a source of the display switch transistor T1 is connected to the data line Data, a drain of the display switch transistor T1 is connected to a first node N1, and a gate of the display switch transistor T1 is connected to the gate line Gate; a source of the sensing switch transistor T2 is connected to a read line (Read Line), a drain of the sensing switch transistor T2 is connected to a second node N2, and a gate of the sensing switch transistor T2 is connected to a sensing control line Sense; a source of the driving transistor T3 is connected to a first power voltage terminal VDD, a drain of the driving transistor T3 is connected to the second node N2, and a gate of the driving transistor T3 is connected to the first node N1; a first terminal of the storage capacitor Cst is connected to the first node N1, and a second terminal of the storage capacitor Cst is connected to the second node N2; an anode of the organic light-emitting diode OLED is connected to the second node N2, and a cathode of the organic light-emitting diode OLED is connected to a second power voltage terminal VSS.

When only external compensation is performed on the pixel circuit, the operation of the sub-pixel circuit at least includes the following two phases: a display phase (including a process for writing data voltage Vdata) and a sensing phase (including a process for reading current).

During the display phase, a high-level signal is written to a scan line, such that the display switch transistor T1 is turned on, the data voltage Vdata in the data line Data is written to the first node N1, the storage capacitor Cst is charged, and the organic light-emitting diode OLED is driven to emit light by the driving transistor T3.

During the sensing phase, a high-level signal is written to the gate line Gate and the sensing control line Sense, such that the second transistor T2 and the driving transistor T3 are turned on, a test voltage Vsense is written to the first node N1 through the data line Data, and an electric signal at a drain of the driving transistor T3 is read through the sensing switch transistor T2 and output through the read line (Read Line), so that an external compensation circuit compensates for a mobility of the driving transistor T3 by means of the output electric signal.

It should be noted that it belongs to a conventional technology in the art to perform external compensation on the pixel circuit in the display panel, and the specific compensation process and principle are not described herein again.

Figure 4:
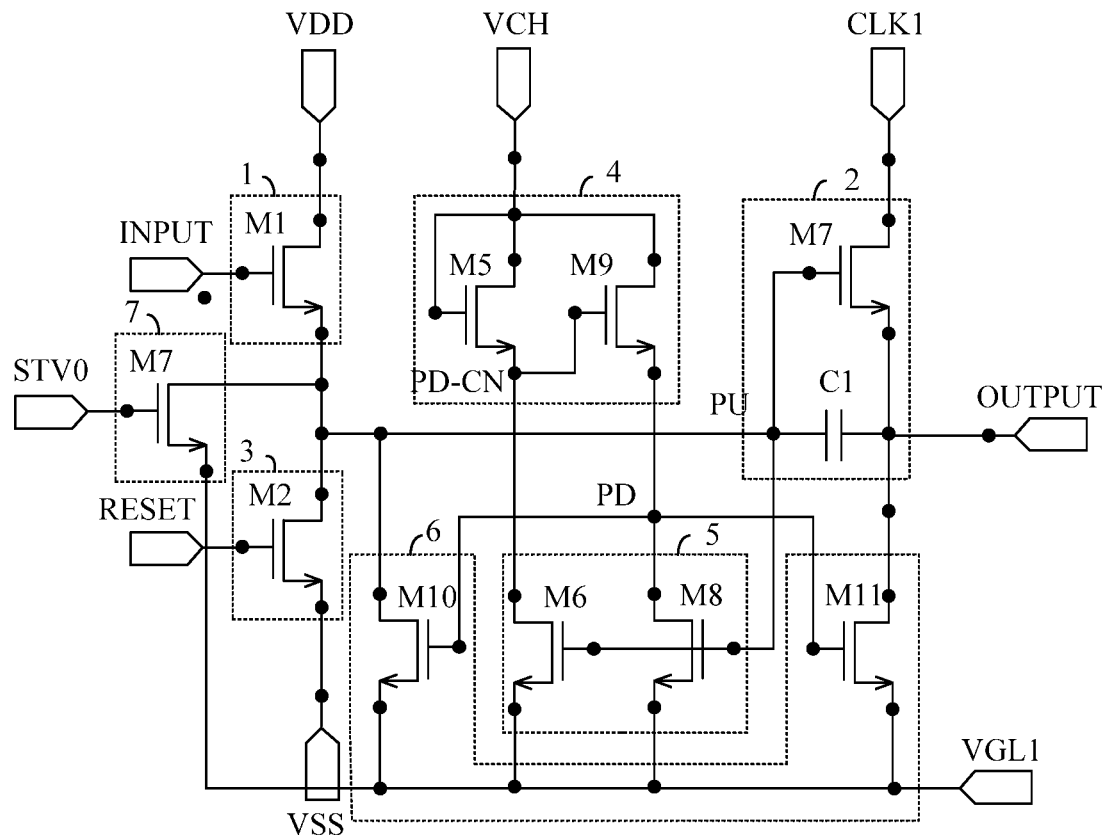
FIG. 4 is a circuit diagram of an exemplary shift register unit.

FIG. 4 is a circuit diagram of an exemplary shift register unit. As shown in FIG. 4, the shift register unit includes an input sub-circuit 1, an output sub-circuit 2, a reset sub-circuit 3, a pull-down control sub-circuit 4, a pull-down sub-circuit 5, a noise reduction sub-circuit 6, and a discharge sub-circuit 7; wherein the input sub-circuit 1 includes a first transistor M1; the reset sub-circuit 3 includes a second transistor M2; the output sub-circuit 2 includes a third transistor M3 and a first capacitor C; the pull-down control sub-circuit 4 includes a fifth transistor M5 and a ninth transistor M9; the pull-down sub-circuit 5 includes a sixth transistor M6 and an eighth transistor M8; the noise reduction sub-circuit 6 includes a tenth transistor M10, an eleventh transistor M11; the discharge sub-circuit 7 includes a seventh transistor M7.

With continued reference to FIG. 4, a gate and a source of the first transistor M1 are connected to a signal input INPUT, and a drain of the first transistor M1 is connected to a pull-up node PU; a gate of the second transistor M2 is connected to a pull-up reset signal terminal RESET, a source of the second transistor M2 is connected to the pull-up node PU, and a drain of the second transistor M2 is connected to a low-level signal terminal; a gate of the third transistor M3 is connected to the pull-up node PU, a source of the third transistor M3 is connected to a clock signal terminal, and a drain of the third transistor M3 is connected to a signal output terminal OUTPUT; a first terminal of the first capacitor C is connected to the pull-up node PU, and a second terminal of the first capacitor C is connected to the signal output terminal OUTPUT; a gate and a source of the fifth transistor M5 are both connected to the first power voltage terminal, and a drain of the fifth transistor M5 is connected to a pull-down control node PD_CN; a gate of the ninth transistor M9 is connected to the pull-down control node PD_CN, a source of the ninth transistor M9 is connected to the first power voltage terminal, and a drain of the ninth transistor M9 is connected to the pull-down node PD; a gate of the sixth transistor M6 is connected to the pull-up node PU, a source of the sixth transistor M6 is connected to the first pull-down node PD1, and a drain of the sixth transistor M6 is connected to the low-level signal terminal; a gate of the eighth transistor M8 is connected to the pull-up node PU, a source of the eighth transistor M8 is connected to the pull-down control node PD_CN, and a drain of the eighth transistor M8 is connected to the low-level signal terminal; a gate of the transistor M10 is connected to the pull-down node PD, a source of the transistor M10 is connected to the pull-up node PU, and a drain of the transistor M10 is connected to the low-level signal terminal; a gate of the eleventh transistor M11 is connected to the pull-down node PD, a source of the eleventh transistor M11 is connected to the signal output terminal OUTPUT, and a drain of the eleventh transistor M11 is connected to the low-level signal terminal; a gate of the seventh transistor M7 is connected to a pre-frame start signal terminal STV0, a source of the seventh transistor M7 is connected to the pull-up node PU, and a drain of the seventh transistor M7 is connected to the low-level signal terminal.

The operation principle of the shift register unit shown in FIG. 4 will be explained below.

In a discharging phase, before a frame, that is, before display, a high-level signal is input to the pre-frame start signal terminal, such that the seventh transistor M7 is turned on, and the pull-up node PU is discharged through a low-level signal input at the low-level signal terminal, which prevents display abnormality from being caused by residual charges of the pull-up node PU.

In an input phase, a high-level signal is input to the signal input terminal INPUT, such that the first transistor M1 is turned on, the pull-up node PU is pulled up by the high-level signal, and the first capacitor C is charged.

In an output phase, since the pull-up node PU is pulled up in the input phase, the third transistor M3 is turned on, and a high-level signal input at the clock signal terminal is output to the gate line Gate connected thereto through the signal output terminal OUTPUT, and the high-level signal output from a signal output terminal OUTPUT of the shift register unit in the present stage is provided to a reset signal terminal RESET of the shift register unit in the previous stage and a signal input terminal INPUT of the shift register unit in the next stage.

In a reset phase, a high-level signal is input to the reset signal terminal RESET, such that the second transistor M2 is turned on, a low-level signal input through the low-level signal terminal pulls down a potential of the pull-up node PU to reset the pull-up node PU, and since the pull-up node PU is pulled down, the third transistor M3 is turned off, and the signal output terminal OUTPUT no longer outputs a high-level signal. Meanwhile, the pull-down control node PD_CN and the pull-down node PD both have high-level signals, transistors M10 and M11 are turned on, and noise reduction is performed on the output of the pull-up node PU and the output of the signal output terminal OUTPUT, respectively, until the potential of the pull-up node PU is pulled up when the scanning for a next frame starts.

At present, a flat panel display device (e.g., a mobile phone) basically completes functions in a fingerprint identification integrated manner, such as unlocking upon boot, identity authentication, consumption payment and the like. For most of mainstream products, an independent fingerprint identification sensor is attached to a specific area of a non-display region Q1 on back or front of a screen module to realize fingerprint identification.

The inventor finds that in the full-screen product era of pursuing the largest screen-to-body ratio, fingerprint identification at any position of the full screen better meets the requirements of people. In the existing full-screen fingerprint identification process, a thickness of a module is increased and the cost is high in an ultrasonic mode or in an external hanging mode; a complicated light path design (such as a collimation structure and the like) is required in an optical integration mode to reduce stray light influence.

In view of the above problems, the following technical solutions are provided in the embodiments of the present disclosure.

Figure 5:
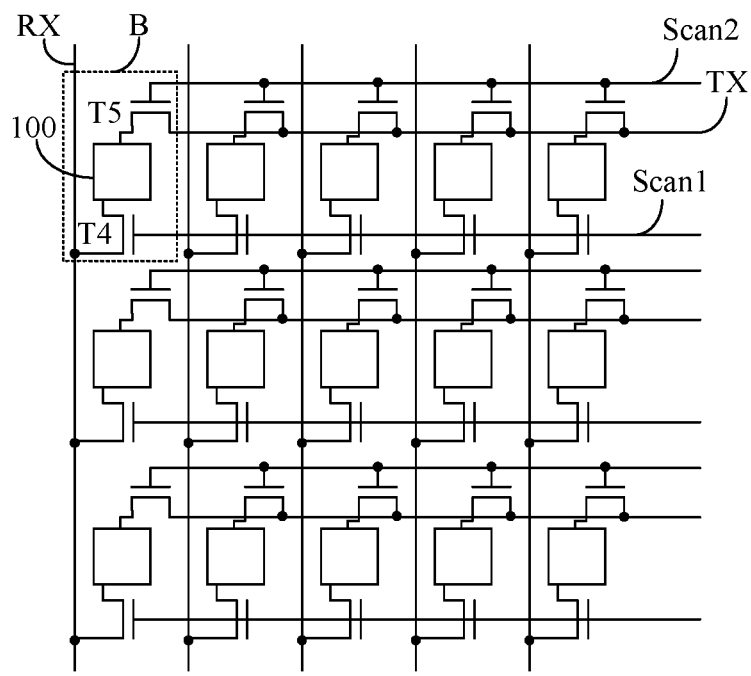
FIG. 5 is a schematic diagram of a display substrate according to an embodiment of the present disclosure.

In a first aspect, FIG. 5 is a schematic view of a display substrate according to an embodiment of the present disclosure. As shown in FIG. 5, an embodiment of the present disclosure provides a display substrate having a display region Q1; the display substrate includes a base substrate 101. A plurality of pixel units located in a display region Q1 and a plurality of fingerprint identification units located in the display region Q1 are provided on the base substrate 101. A fingerprint identification circuit is provided in the fingerprint identification unit. The fingerprint identification circuit includes a control sub-circuit and a detection electrode 100. In a fingerprint identification phase, the control sub-circuit is configured to read a capacitance formed between the detection electrode 100 and valley and ridge of the fingerprint in response to a fingerprint scanning signal, to perform the fingerprint identification. The structure in the pixel unit may be the same as that in the display substrate described above.

Since the fingerprint identification circuit is provided in the display region Q1 of the display substrate of the embodiment of the present disclosure, when the display substrate of the embodiment is applied to a display panel, fingerprint sensing may be achieved in the display region Q1. Specifically, when a touch occurs, a fingerprint imaging is realized according to a difference of the capacitance formed between the valley and ridge of the fingerprint and the detection electrode 100, so that the fingerprint identification function is realized. The display substrate may be used in various scenes such as identity recognition, card punching for attendance, payment for consumption and the like.

In some embodiments, the control sub-circuit in the fingerprint identification circuit includes, but is not limited to, a read switch transistor T4 and an initialization switch transistor T5; a source of the read switch transistor is connected to a sensing signal line RX, a drain of the read switch transistor is connected to the detection electrode 100, and a gate of the read switch transistor is connected to a fingerprint scanning line Scan1; a source of the initialization switch transistor T5 is connected to a driving signal line TX, a drain of the initialization switch transistor T5 is connected to the detection electrode 100, and a gate of the initialization switch transistor T5 is connected to an initialization control signal line Scan2.

In the fingerprint identification phase, first, a high-level signal is written into the initialization control signal line Scan2, such that the initialization switch transistor T5 is turned on, a square wave signal is written into the driving signal line TX, and the detection electrode 100 is reset to 0V from a suspended state by a low-level signal (for example, ground 0V) of the square wave signal, so as to complete the initialization of the detection electrode 100. Then, a high-level signal is written into the fingerprint scanning line Scan1, such that the read switch transistor is turned on, and due to the difference of the capacitance formed between the detection electrode 100 and the valley and ridge of the fingerprint, that is, the stored charge amounts are different, a processor may obtain a fingerprint image according to a charge difference output from the sensing signal line RX at this time, thereby realizing the fingerprint identification.

In some embodiments, as shown in FIG. 5, the fingerprint identification units in the display substrate are arranged in an array. Of course, since one fingerprint identification circuit is disposed in each fingerprint identification unit, the fingerprint identification circuits in the display substrate are also arranged in an array. That is to say, the display panel of the display substrate of the embodiment of the present disclosure may realize full-screen fingerprint identification. In one example, gates of the read switch transistors T4 of the fingerprint identification circuits in a same row are connected to a same fingerprint scan line Scan1; sources of the read switch transistors T4 of the fingerprint identification circuits in a same column are connected to a same sensing signal line RX; gates of the initialization switch transistors T5 in the fingerprint identification circuits in a same row are connected to a same initialization control signal line Scan2; sources of the initialization switch transistors T5 in the fingerprint identification circuits in a same row are connected to a same driving signal line TX. In this way, wiring is facilitated, while it is convenient to control fingerprint recognition circuits. In the embodiment of the present disclosure, description will be made by taking an example in which the fingerprint identification circuits in the display substrate are arranged in an array.

Figure 6:
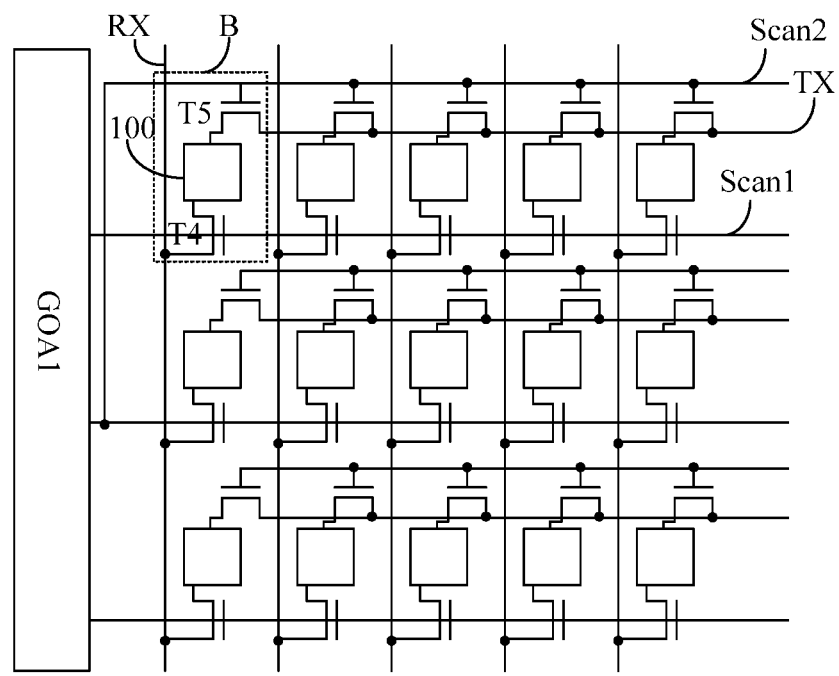
FIG. 6 is a schematic diagram of a display substrate according to an embodiment of the present disclosure.

In some embodiments, FIG. 6 is a schematic view of another display substrate according to embodiments of the present disclosure. As shown in FIG. 6, the fingerprint scanning signal on each fingerprint scanning line Scan1 in the display substrate is provided by the gate driving circuit disposed in the peripheral region Q2 of the base substrate 101. A structure of the gate driving circuit may be the same as that of the gate driving circuit providing the gate scanning signal for each gate line Gate in the display substrate. In the embodiment of the present disclosure, the gate driving circuit providing the fingerprint scanning signal is referred to as a first gate driving circuit, and a shift register unit cascaded in the first gate driving circuit is referred to as a first shift register unit; the gate driving circuit for providing the gate scanning signal is referred to as a second gate driving circuit, and a shift register unit cascaded in the second gate driving circuit is referred to as a second shift register unit. A signal output terminal of a first shift register unit in the current stage is connected to a signal input terminal of a first shift register unit in the next stage, and is connected to a pull-up reset signal terminal of a first shift register unit in the previous stage.

In an example, the number of the first shift register units in the first gate driving circuit is the same as the number of the fingerprint scanning lines Scan1 included in the display substrate. At this time, the first shift register units are connected to the fingerprint scanning lines Scan1 in a one-to-one correspondence. A signal output terminal of an Nth shift register unit is connected to an Nth fingerprint scanning line Scan1, and is also connected to a (N+1)th initialization control line. That is to say, when an Nth row of fingerprint identification circuits performs fingerprint identification, an (N+1)th row of fingerprint identification circuits performs initialization, so that the scanning rate of the fingerprint identification circuits in the display substrate is effectively improved, and the display effect of the display substrate is improved.

In some embodiments, in order to reduce the scanning time of the fingerprint identification circuit in the display substrate, to prevent the display effect of the display panel from being affected due to a long time occupied by the fingerprint identification phase, two ends of each fingerprint scanning line Scan1 are both provided with first gate drive circuits, and the two ends of each fingerprint scanning line Scan1 are respectively connected to one first shift register unit so as to improve the scanning rate of the fingerprint identification circuit, so that the time occupied by the fingerprint identification phase is shortened, and the display panel of the embodiment of the present disclosure has a better display effect.

In some embodiments, the pixel circuit in each pixel unit may adopt the pixel circuit shown in FIG. 2, but the use of the pixel circuit shown in FIG. 2 does not constitute a limitation to a scope of the embodiments of the present disclosure. The pixel circuit may also adopt various pixel circuits of other already-configured structures, such as, 4T1C, 7T1C, etc., which may be determined according to the requirements of the display device on a pixel resolution. In the embodiment of the present disclosure, the pixel units in the display region Q1 may be arranged in an array. Since one pixel circuit is disposed in each pixel unit, the pixel circuits in the display substrate are also arranged in an array. Gates of the display switch transistors in the pixel circuits in the same row are connected to the same gate line Gate, and sources of the display switch transistors in the pixel circuits in the same column are connected to the same data line Data. In this way, wiring is facilitated, while it is convenient to control pixel circuits.

Figure 7:
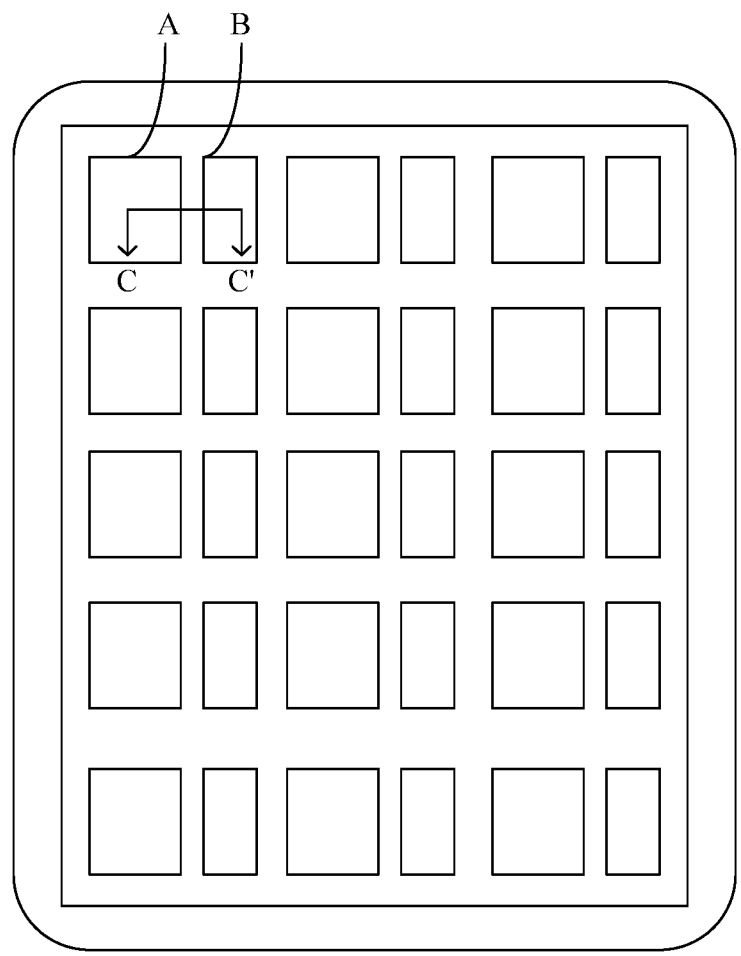
FIG. 7 is a schematic diagram of a distribution of pixel units and fingerprint identification units in a display substrate according to an embodiment of the present disclosure.

In some embodiments, in the row direction or the column direction, a plurality of pixel circuits are provided between two adjacent fingerprint identification circuits. Alternatively, in the row direction or the column direction, a plurality of fingerprint identification circuits are provided between two adjacent pixel circuits. Alternatively, in the row direction or the column direction, the fingerprint identification circuits and the pixel circuits are alternately provided. FIG. 7 is a schematic diagram of a distribution of pixel units and fingerprint identification units in a display substrate according to an embodiment of the present disclosure. As shown in FIG. 7, in order to ensure the display effect of the display panel and ensure the sensitivity of the fingerprint identification function, it is preferable in the embodiment of the present disclosure to adopt a case in which the fingerprint identification circuits and the pixel circuits are alternately provided in the row direction or the column direction. In the following description, the fingerprint identification circuits and the pixel circuits are alternately provided in the row direction for illustration.

It should be noted here that the read switch transistor T4 and the initialization switch transistor T5 in the fingerprint identification circuit; the display switch transistor, the sensing switch transistor and the driving transistor in the pixel circuit are all thin film transistors. In some embodiments, film structures of the thin film transistors in the fingerprint identification circuit are provided in the same layer and have the same material as film structures of the thin film transistors in the pixel circuit, respectively. For example, the source of the read switch transistor T4 in the fingerprint identification circuit and the source of the driving transistor in the pixel circuit are provided in the same layer and are made of the same material. In some embodiments, in order to ensure the touch sensitivity of the display panel, when the display substrate in the embodiments of the present disclosure is applied to the display panel, the detection electrode 100 in the fingerprint identification circuit is closer to a display surface side of the display panel than the thin film transistors. The display surface side of the display panel is determined by a light outgoing direction of the light-emitting device in the display substrate, and the light outgoing direction of the light-emitting device is determined by a type of the light-emitting device. Types for the light-emitting device include a bottom emission type and a top emission type. The display substrate in the embodiment of the present disclosure will be described below by taking an example in which the display substrate includes the bottom emission type light-emitting device and the top emission type light-emitting device, respectively.

Figure 8:
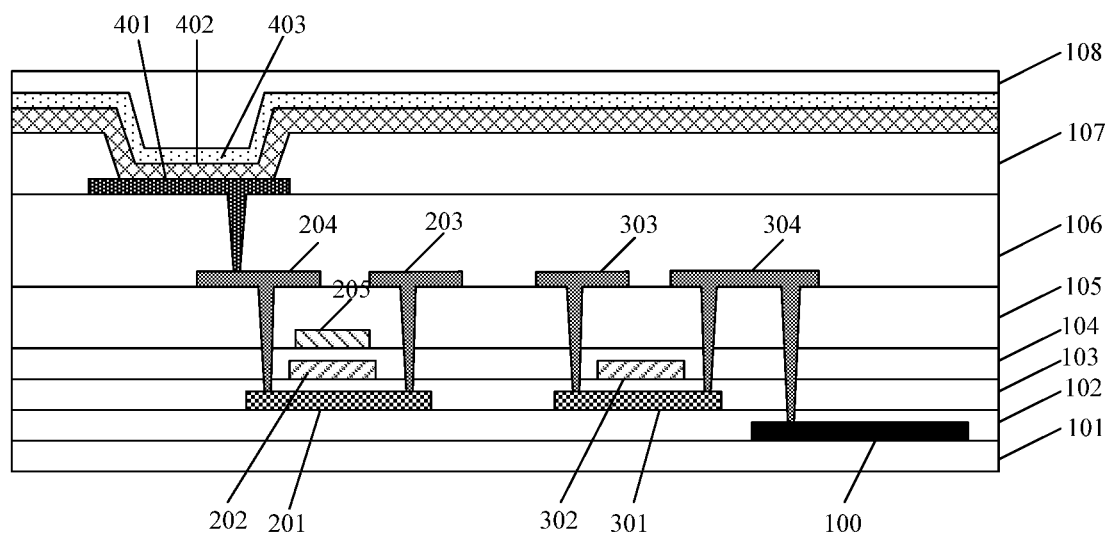
FIG. 8 is a cross-sectional view taken along a C-C' line of FIG. 7.

In one example, FIG. 8 is a cross-sectional view taken along a C-C' line of FIG. 7. As shown in FIG. 8, the description will be made only by taking as examples the cross-sectional views of the driving transistor and the light-emitting device in the pixel circuit, and the read switch transistor T4 and the detection electrode 100 in the fingerprint identification circuit. The driving transistor and the read switch transistor T4 are top gate type thin film transistors, and the light-emitting device is the bottom emission type light-emitting device. In a direction distal to the base substrate 101, the detection electrode 100 is disposed on the base substrate 101, a buffer layer 102 is disposed on a layer on which the detection electrode 100 is disposed, an active layer 201 of the driving transistor and an active layer 301 of the read switch transistor T4 are disposed on the buffer layer 102, a first gate insulating layer 103 is disposed on a layer on which the active layer 201 of the driving transistor and the active layer 301 of the read switch transistor T4 are disposed, a gate 202 of the driving transistor (which also serves as a first plate of the storage capacitor) and a gate 302 of the read switch transistor T4 are disposed on the first gate insulating layer 103, a second gate insulating layer 104 is formed on a layer on which the gate 202 of the driving transistor and the gate 302 of the read switch transistor T4 are disposed, and a second plate 205 of the storage capacitor is disposed on the second gate insulating layer 104; an interlayer insulating layer 105 is provided on a layer where the second plate 205 of the storage capacitor is located; a source 203 and a drain 204 of the driving transistor and a source 303 and a drain 304 of the read switch transistor T4 are provided on the interlayer insulating layer 105, wherein the source 203 and the drain 204 of the driving transistor are connected to the active layer 201 thereof through vias extending through the first gate insulating layer 103, the second gate insulating layer 104 and the interlayer insulating layer 105, respectively; the source 302 and the drain 303 of the read switch transistor T4 are connected to the active layer 301 thereof through vias extending through the first gate insulating layer 103, the second gate insulating layer 104, and the interlayer insulating layer 105, respectively. A planarization layer 106 is provided on a layer where the source 203 and the drain 204 of the driving transistor and the source 303 and the drain 304 of the read switch transistor T4 are located; an anode 401 of the light-emitting device is provided on the planarization layer 106, the anode 401 being connected to the drain of the driving transistor through a via extending through the planarization layer 106; a pixel defining layer 107 is provided on a layer on which the anode 401 is disposed, the pixel defining layer 107 having a receiving portion, and exposing the anode 401 of the light-emitting device at a position of the receiving portion; a light-emitting layer 402, a cathode 403, and an encapsulation layer 108 of a light-emitting device are sequentially disposed on the pixel defining layer 107.

Figure 9:
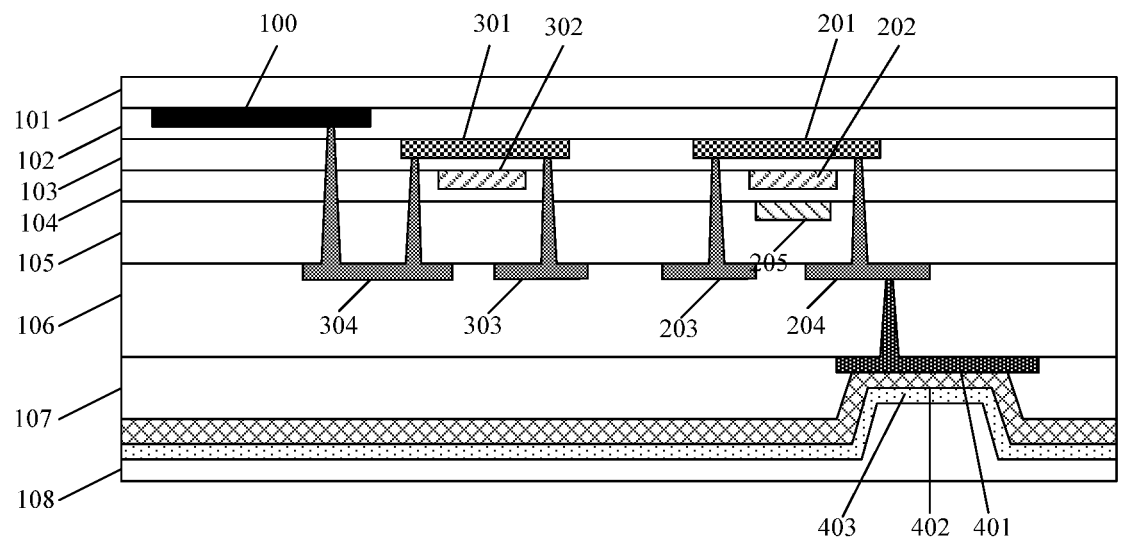
FIG. 9 is a schematic diagram of the display substrate of FIG. 8 applied for a display panel.

FIG. 9 is a schematic diagram of the display substrate of FIG. 8 applied for a display panel. As shown in FIG. 9, the detection electrode 100 is proximal to the display surface side with respect to the driving transistor and the read switch transistor T4.

In some embodiments, for the above display substrate, a top gate thin film transistor is used as the thin film transistor, so as to prevent the light from affecting the optical characteristics of an active layer of the thin film transistor. A light-shielding layer is usually disposed on a side of the active layer of the thin film transistor proximal to the base substrate 101, and an orthographic projection of the light-shielding layer on the base substrate 101 covers an orthographic projection of the active layer of the thin film transistor on the base substrate 101. Since the light-shielding layer is usually made of light-shielding metal, the detection electrode 100 and the light-shielding layer may be disposed in a same layer and made of the same material in the embodiments of the present disclosure. Thus, the detection electrode 100 may be formed while the light-shielding layer is formed, which neither increases a thickness of the display substrate nor increases the number of process steps. Alternatively, the detection electrode 100 may also be made of a different material from the light-shielding layer. For example, the detection electrode 100 may be made of indium tin oxide (ITO).

Figure 10:
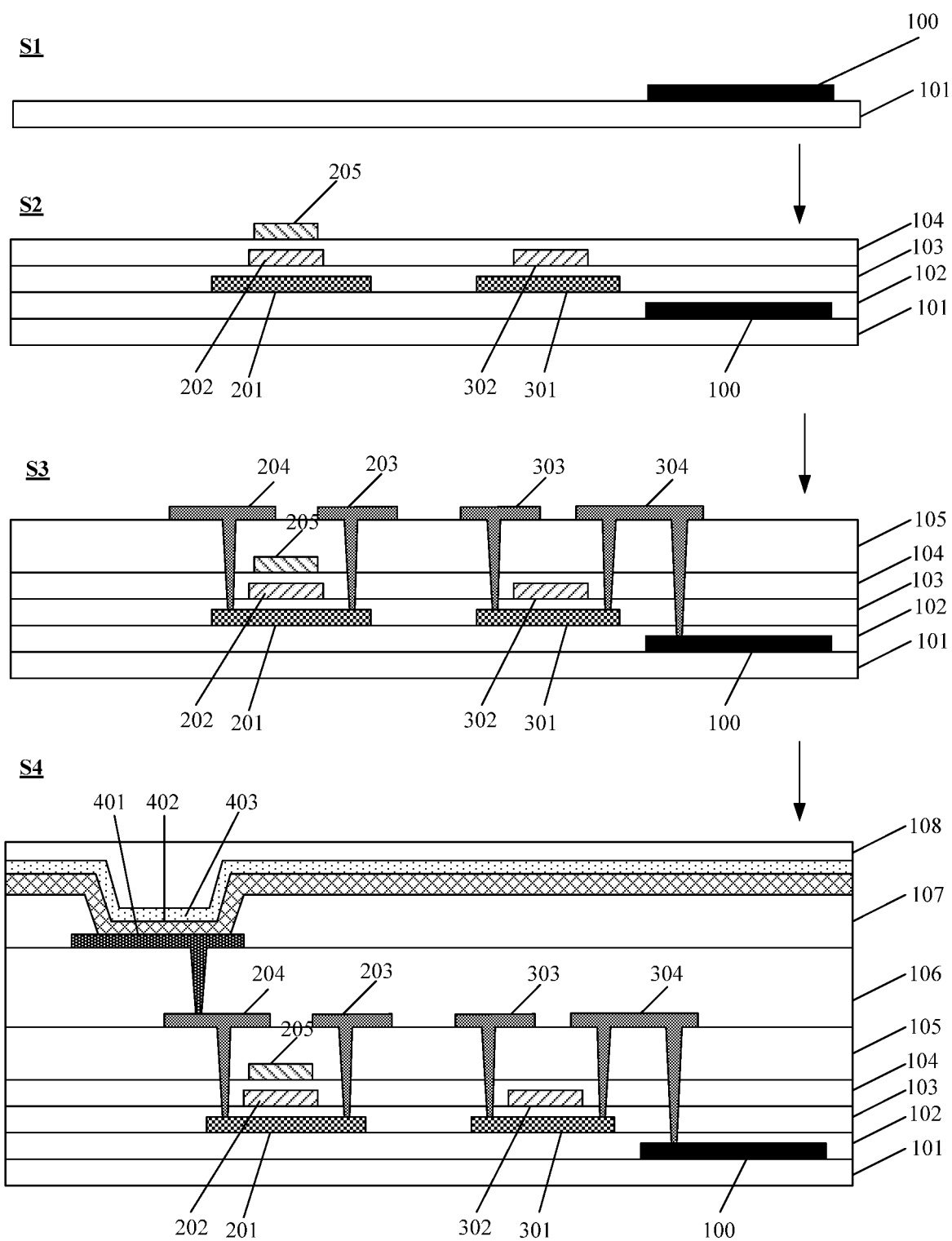
FIG. 10 is a flow chart illustrating a manufacturing process for the display substrate shown in FIG. 8.

FIG. 10 is a flow chart illustrating a manufacturing process for the display substrate shown in FIG. 8. As shown in FIG. 10, the following description will be made with reference to the manufacturing method for the display substrate, in order to make the structure of the display substrate clear. The manufacturing method includes following steps:

S1, providing a base substrate 101, wherein a buffer layer (not shown) is formed on the base substrate 101, and a pattern of a detection electrode 100 is formed on the base substrate 101 through a patterning process. The detection electrodes 100 on the base substrate 101 are arranged in an array.

In the step S1, the base substrate 101 is used as a support for the light-emitting device, has good light transmittance in a visible light region and certain capability of preventing water vapor and oxygen from permeating, and has good surface smoothness, and may be generally made of glass, a flexible substrate, an array substrate or the like. If the flexible substrate is selected, it may be made of polyester, polyimide or a relatively thin metal. The buffer layer may be made of a material with a lattice structure similar to that of Si, such as $Si_xN_y$ or $Si_xO_y$: silicon nitride or silicon oxide. Specifically, the buffer layer may have a single-layer structure with silicon nitride or silicon oxide, or may have a composite film structure with silicon nitride or silicon oxide. The detection electrode 100 may be made of a light-shielding metal, such as molybdenum, aluminum, etc., or a transparent conductive metal oxide, such as indium tin oxide, etc.

S2, sequentially depositing a buffer layer 102 and an a-Si layer on the base substrate 101 on which the detection electrode 100 is formed, performing ion doping crystallization on the a-Si layer to form polysilicon, forming an active layer 201 of a driving transistor and an active layer 301 of a read switch transistor T4 through the patterning process, then forming a first gate insulating layer 103 by depositing, forming a pattern including a gate 202 of the driving transistor and a gate 302 of the read switch transistor T4 through the patterning process, forming a second gate insulating layer by depositing, and forming a second plate 205 of a storage capacitor through the patterning process. It should be noted that the gate 202 of the driving transistor is formed to have a larger a size than a size of a gate of other thin film transistor, and the gate of the driving transistor also serves as the first plate of the storage capacitor.

In the step S2, the buffer layer 102, the first gate insulating layer 103, and the second gate insulating layer 104 may be made of a material having a lattice structure similar to that of Si, such as $Si_xN_y$ or $Si_xO_y$: silicon nitride or silicon oxide, specifically, may have a single-layer structure with silicon nitride or silicon oxide, or may have a composite film structure with silicon nitride or silicon oxide. The material of the gate (first plate) and the second plate 205 may include a metal material or an alloy material, such as molybdenum, aluminum, titanium, and the like.

S3, depositing an interlayer insulating layer 105 on the layer where the gate is formed, forming vias extending through the interlayer insulating layer, the first gate insulating layer 103, and the second gate insulating layer 104 at a source contact region and a drain contact region corresponding to the active layer 201 of the driving transistor and the active layer 301 of the read switch transistor T4, and forming vias extending through the interlayer insulating layer 105, the first gate insulating layer 103, the second gate insulating layer 104, and the buffer layer 102 at positions corresponding to the detection electrodes 100. The source 203 and the drain 204 of the driving transistor and the source 303 and the drain 304 of the read switch transistor T4 are formed through the patterning process, at this time, the sources and the drains of the driving transistor and the read switch transistor T4 are connected to the respective corresponding active layers, and the drain 304 of the read switch transistor T4 is also connected to the detection electrode 100.

In the step S3, the interlayer insulating layer 105 may be made of a material having a lattice structure similar to that of Si, such as $Si_xN_y$ or $Si_xO_y$: silicon nitride or silicon oxide, specifically, may have a single-layer structure with silicon nitride or silicon oxide, or may have a composite film structure with silicon nitride or silicon oxide. The material of the source and the drain may include a metal material or an alloy material, such as a metal single-layer or multi-layer structure formed of molybdenum, aluminum, titanium, and the like. For example, the multi-layer structure is a multi-metal layer stack, such as a metal stack (Al/Ti/Al) having three layers of titanium, aluminum, titanium, and the like.

S4, forming a planarization layer 106 on the layer where the source and the drain are formed, forming a via at a position of the planarization layer 106 corresponding to the drain of the driving transistor, forming an anode 401 of the light-emitting device on the planarization layer 106 through the patterning process, the anode 401 being connected to the drain of the driving transistor through the via extending through the planarization layer 106; forming a pixel defining layer 107 on the layer on which the anode 401 is located, and forming a receiving portion at a position of the pixel defining layer 107 corresponding to the anode 401; forming a light-emitting layer 402 on the pixel defining layer 107 by an evaporation process, and forming a cathode 403 on the light-emitting layer 402. Since the light-emitting device is the bottom emission type light-emitting device, the anode 401 is a transmissive electrode and the cathode 403 is a reflective electrode.

In the step S4, the planarization layer 106 may have a single-layer structure or a multi-layer structure; the planarization layer 106 is typically made of organic materials, such as: photoresist, acrylic-based polymers, silicon-based polymers, and the like. The anode 401 may be made of indium tin oxide (ITO), indium zinc oxide (IZO), zinc oxide (ZnO), etc. The pixel defining layer may be made of organic materials, such as: photoresist. The light-emitting layer 402 may include a small molecule organic material or a polymer molecule organic material, may be a fluorescent light-emitting material or a phosphorescent light-emitting material, may emit red light, green light, blue light, or may emit white light. In addition, according to different actual needs, in different examples, the light-emitting layer 402 may further include functional layers such as an electron injection layer, an electron transport layer, a hole injection layer, and a hole transport layer. The cathode 403 may be made of lithium (Li), aluminum (Al), magnesium (Mg), silver (Ag), or other metal material.

Now, the display substrate is completed. It should be noted that, in the above description, only the manufacturing process for the driving transistor and the storage capacitor in the pixel circuit and the detection electrode 100 and the read switch transistor T4 in the fingerprint identification circuit is described. In fact, the display switch transistor, the sensing switch transistor and the initialization switch transistor T5 may be formed while the driving transistor and the read switch transistor T4 are formed. When the display substrate is applied to the display panel, the display substrate needs to be turned over for use.

Figure 11:
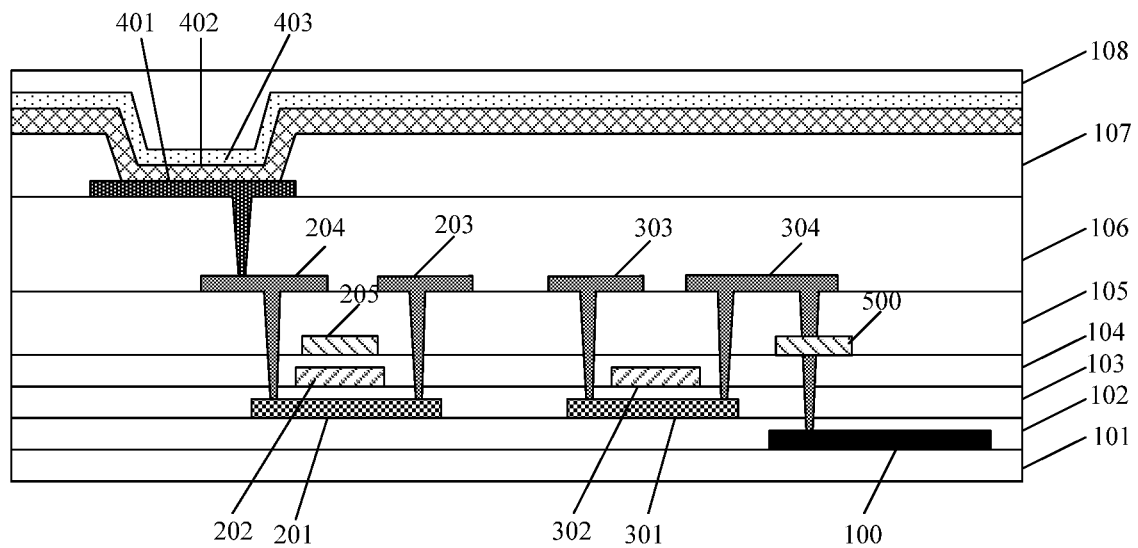
FIG. 11 is another cross-sectional view taken along a C-C' line of FIG. 7.

In another example, FIG. 11 is another cross-sectional view taken along a C-C' line of FIG. 7. As shown in FIG. 11, the display substrate is substantially the same as the display substrate shown in FIG. 8, except that the read switch transistor T4 is connected to the detection electrode 100 through a transition electrode 500, and the transition electrode 500 and the second plate 205 of the storage capacitor are disposed in a same layer and made of a same material. At this time, the drain of the read switch transistor T4 is connected to the transition electrode 500 through a via extending through the interlayer insulating layer 105, and the transition electrode 500 is connected to the detection electrode 100 through a via extending through the gate insulating layers (the first gate insulating layer 103 and the second gate insulating layer 104). This is because a distance between an upper surface of the interlayer insulating layer 105 and the detection electrode 100 is too large. When connection vias for the source, drain and active layer of the read switch transistor T4 are formed by etching, there is a risk that the vias cannot be etched through if the connection vias for the detection electrode 100 and the drain of the read switch transistor T4 are simultaneously formed by etching. Other structures of the display substrate are the same as those shown in FIG. 8, and thus, the description thereof is not repeated.

Figure 12:
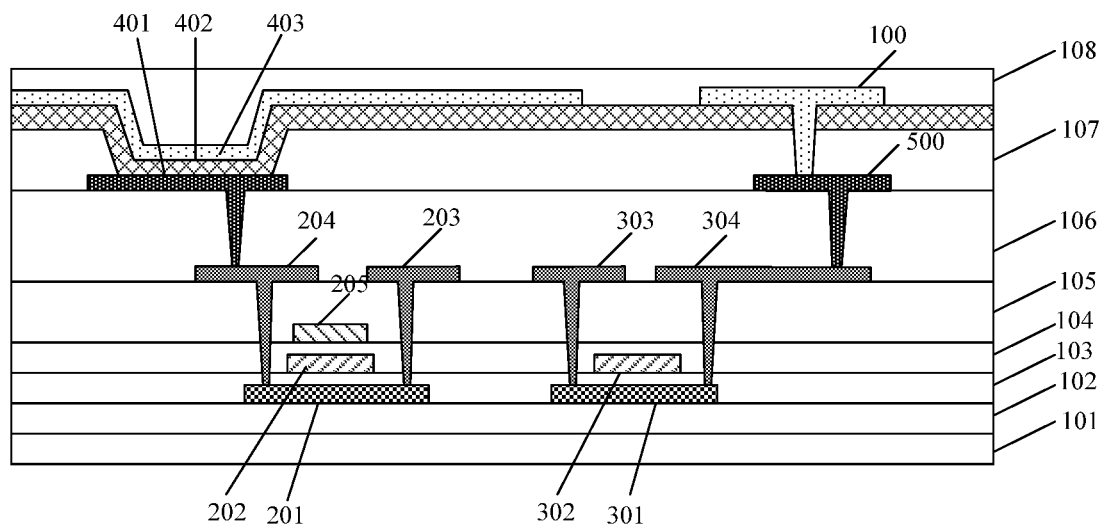
FIG. 12 is another cross-sectional view taken along a C-C' line of FIG. 7.

In another example, FIG. 12 is another cross-sectional view taken along a C-C' line of FIG. 7. As shown in FIG. 12, the structure of the display substrate is substantially the same as that of the display substrate shown in FIG. 8, except that the light-emitting device is a top emission type light-emitting device. In this case, the anode 401 of the light-emitting device is a reflective electrode and the cathode 403 is a transmissive electrode. The detection electrode 100 and the cathode 403 are disposed in a same layer and made of a same material. A transition electrode 500 is provided in a layer where the anode 401 of the light-emitting device is located, the transition electrode 500 is made of the same material as the anode 401 of the light-emitting device; the transition electrode 500 is connected to the drain 204 of the read switch transistor T4 through a via extending through the planarization layer 106; the detection electrode 100 is connected to the transition electrode through a via extending through the pixel defining layer 107, thereby establishing the connection between the detection electrode 100 and the drain 204 of the switch transistor T4. Other structures of the display substrate are the same as those shown in FIG. 8, and thus, the description thereof is not repeated. When the display substrate with such a structure is applied to the display panel, the display substrate does not need to be turned over for use.

In a second aspect, an embodiment of the present disclosure provides a display device, which includes the display substrate described above, so that full-screen fingerprint identification may be achieved.

The display device may be: an electronic paper, an OLED panel, a QLED panel, a mobile phone, a tablet computer, a television, a display, a notebook computer, a digital photo frame, a navigator and any product or component with a display function.

It should be understood that the foregoing embodiments are merely exemplary embodiments adopted to explain the principle of the present disclosure, and the present disclosure is not limited thereto. It will be apparent to a person skilled in the art that various modifications and improvements may be made without departing from the spirit and scope of the present disclosure, and such modifications and improvements also fall within the scope of the present disclosure.

What is claimed is:

1. A display substrate, comprising:
a base substrate having a display region;
a plurality of fingerprint identification circuits in the display region of the base substrate, wherein each fingerprint identification circuit of the plurality of fingerprint identification circuits comprises a control sub-circuit and a detection electrode; wherein
in a fingerprint identification phase, the control sub-circuit is configured to read a capacitance between the detection electrode and a valley and a ridge of a fingerprint in response to a fingerprint scanning signal, so as to perform fingerprint identifications;
wherein the display substrate further comprises a plurality of pixel circuits in the display region of the base substrate, wherein each of the plurality of pixel circuits comprises a pixel driving sub-circuit and a light-emitting device on the base substrate;
wherein the pixel driving sub-circuit is configured to control the light-emitting device to emit light according to a data voltage signal in response to a gate scanning signal; and
wherein the light-emitting device is a bottom emission type light-emitting device, and the detection electrode is on the base substrate at a side closer to the base substrate than of the control sub-circuit.

2. The display substrate of claim 1, wherein the pixel driving sub-circuit and the control sub-circuit each comprise a thin film transistor; the thin film transistor is a top gate thin film transistor;
a light-shielding layer is on a side of the thin film transistor proximal to the base substrate, and an orthographic projection of the light-shielding layer on the base substrate covers an orthographic projection of an active layer of the thin film transistor on the base substrate; and the detection electrode and the light-shielding layer are in a same layer and are made of a same material.

3. The display substrate of claim 2, wherein the control sub-circuit at least comprises: a read switch transistor and an initialization switch transistor;

a control electrode of the read switch transistor is connected to a fingerprint scanning signal line, a first electrode of the read switch transistor is connected to the sensing signal line, and a second electrode of the read switch transistor is connected to the detection electrode; and a control electrode of the initialization switch transistor is connected to an initialization control signal line, a first electrode of the initialization switch transistor is connected to the driving signal line, and a second electrode of the initialization switch transistor is connected to the detection electrode.

4. The display substrate of claim 3, wherein the pixel driving sub-circuit comprises a driving transistor and a storage capacitor; a control electrode of the driving transistor is used as a first plate of the storage capacitor; a second plate of the storage capacitor is on a side of the first plate distal to the base substrate; a second gate insulating layer is between the second plate and the first plate; a first gate insulating layer is between the control electrode and the active layer of the driving transistor; each layer of the driving transistor and corresponding layer of the read switch transistor are in a same layer and are made of the same material;

the detection electrode is on a side of the read switch transistor proximal to the base substrate, a buffer layer is between a layer where an active layer of the read switch transistor is located and a layer where the detection electrode is located; a transition electrode is also provided in a layer where the second plate is located, and is made of a same material as the second plate;

a second electrode of the read switch transistor is connected to the transition electrode through a via extending through the interlayer insulating layer; the transition electrode is connected to the detection electrode through a via extending through the first gate insulating layer, the second gate insulating layer and the buffer layer.

5. The display substrate of claim 3, wherein the pixel driving sub-circuit comprises a driving transistor; and each layer of the driving transistor and a corresponding layer of the read switch transistor are in a same layer and are made of a same material;

a planarization layer is between a layer where a source and a drain of the driving transistor are located and a layer where the anode of the light-emitting device is located; a pixel defining layer is on a side, distal to the base substrate, of the layer where the anode of the light-emitting device is located;

the detection electrode and a cathode of the light-emitting device are in a same layer, the anode layer of the light-emitting device is also provided with a transition electrode which is made of the same material as the detection electrode; the transition electrode is connected to the second electrode of the read switch transistor through a via extending through the planarization layer; the detection electrode is connected to the transition electrode through a via extending through the pixel defining layer.

6. The display substrate of claim 3, wherein the plurality of fingerprint identification circuits are arranged in an array, and control electrodes of read switch transistors in the fingerprint identification circuits of a same row are connected to a same fingerprint scanning line; control electrodes of initialization switch transistors in the fingerprint identification circuits of a same row are connected to a same initialization control signal line; and the display substrate further comprises:

a first gate driving circuit on the base substrate; wherein the first gate driving circuit comprises: a plurality of cascaded first shift register units; the first shift register units are connected to the fingerprint scanning signal lines in a one-to-one correspondence;

a signal output terminal of an Nth first shift register unit is connected to an Nth fingerprint scanning signal line and an (N+1)th initialization control signal line; N≥1.

7. The display substrate of claim 3, wherein the plurality of fingerprint identification circuits are arranged in an array, and first electrodes of read switch transistors in the fingerprint identification circuits of a same column are connected to a same sensing signal line; and first electrodes of initialization switch transistors in the fingerprint identification circuits of a same row are connected to a same driving signal line.

8. The display substrate of claim 1, wherein the plurality of pixel circuits are arranged in an array, and the pixel circuits and the fingerprint identification circuits are alternately arranged in a row direction or a column direction.

9. A display device comprising the display substrate of claim 1.

10. The display substrate of claim 7, wherein the plurality of pixel circuits are arranged in an array, and the pixel circuits and the fingerprint identification circuits are alternately arranged in a row direction or a column direction.

11. A display substrate, comprising:

a base substrate having a display region;

a plurality of fingerprint identification circuits in the display region of the base substrate, wherein each fingerprint identification circuit of the plurality of fingerprint identification circuits comprises a control sub-circuit and a detection electrode; wherein in a fingerprint identification phase, the control sub-circuit is configured to read a capacitance between the detection electrode and a valley and a ridge of a fingerprint in response to a fingerprint scanning signal, so as to perform fingerprint identification;

wherein the display substrate further comprises a plurality of pixel circuits in the display region of the base substrate, wherein each of the plurality of pixel circuits comprises a pixel driving sub-circuit and a light-emitting device;

wherein the pixel driving sub-circuit is configured to control the light-emitting device to emit light according to a data voltage signal in response to a gate scanning signal; and wherein the light-emitting device is a bottom emission type light-emitting device, and the detection electrode is on a side of the control sub-circuit proximal to the base substrate;

wherein the pixel driving sub-circuit and the control sub-circuit each comprise a thin film transistor; the thin film transistor is a top gate thin film transistor;

a light-shielding layer is on a side of the thin film transistor proximal to the base substrate, and an orthographic projection of the light-shielding layer on the base substrate covers an orthographic projection of an active layer of the thin film transistor on the base substrate; and the detection electrode and the light-shielding layer are in a same layer and are made of a same material;

wherein the control sub-circuit at least comprises: a read switch transistor and an initialization switch transistor;

a control electrode of the read switch transistor is connected to a fingerprint scanning signal line, a first electrode of the read switch transistor is connected to the sensing signal line, and a second electrode of the read switch transistor is connected to the detection electrode; and a control electrode of the initialization switch transistor is connected to an initialization control signal line, a first electrode of the initialization switch transistor is connected to the driving signal line, and a second electrode of the initialization switch transistor is connected to the detection electrode;

wherein the pixel driving sub-circuit comprises a driving transistor and a storage capacitor; a control electrode of the driving transistor is used as a first plate of the storage capacitor; a second plate of the storage capacitor is on a side of the first plate distal to the base substrate; a second gate insulating layer is between the second plate and the first plate; a first gate insulating layer is between the control electrode and the active layer of the driving transistor; each layer of the driving transistor and corresponding layer of the read switch transistor are in a same layer and are made of the same material;

the detection electrode is on a side of the read switch transistor proximal to the base substrate, a buffer layer is between a layer where an active layer of the read switch transistor is located and a layer where the detection electrode is located; a transition electrode is also provided in a layer where the second plate is located, and is made of a same material as the second plate;

a second electrode of the read switch transistor is connected to the transition electrode through a via extending through the interlayer insulating layer; the transition electrode is connected to the detection electrode through a via extending through the first gate insulating layer, the second gate insulating layer and the buffer layer.

12. A display substrate, comprising:

a base substrate having a display region;

a plurality of fingerprint identification circuits in the display region of the base substrate, wherein each fingerprint identification circuit of the plurality of fingerprint identification circuits comprises a control sub-circuit and a detection electrode; wherein in a fingerprint identification phase, the control sub-circuit is configured to read a capacitance between the detection electrode and a valley and a ridge of a fingerprint in response to a fingerprint scanning signal, so as to perform fingerprint identification;

wherein the display substrate further comprises a plurality of pixel circuits in the display region of the base substrate, wherein each of the plurality of pixel circuits comprises a pixel driving sub-circuit and a light-emitting device;

wherein the pixel driving sub-circuit is configured to control the light-emitting device to emit light according to a data voltage signal in response to a gate scanning signal; and wherein the light-emitting device is a bottom emission type light-emitting device, and the detection electrode is on a side of the control sub-circuit proximal to the base substrate;

wherein the pixel driving sub-circuit and the control sub-circuit each comprise a thin film transistor; the thin film transistor is a top gate thin film transistor;

a light-shielding layer is on a side of the thin film transistor proximal to the base substrate, and an orthographic projection of the light-shielding layer on the base substrate covers an orthographic projection of an active layer of the thin film transistor on the base substrate; and the detection electrode and the light-shielding layer are in a same layer and are made of a same material;

wherein the control sub-circuit at least comprises: a read switch transistor and an initialization switch transistor;

a control electrode of the read switch transistor is connected to a fingerprint scanning signal line, a first electrode of the read switch transistor is connected to the sensing signal line, and a second electrode of the read switch transistor is connected to the detection electrode; and a control electrode of the initialization switch transistor is connected to an initialization control signal line, a first electrode of the initialization switch transistor is connected to the driving signal line, and a second electrode of the initialization switch transistor is connected to the detection electrode;

wherein the plurality of fingerprint identification circuits are arranged in an array, and control electrodes of read switch transistors in the fingerprint identification circuits of a same row are connected to a same fingerprint scanning line; control electrodes of initialization switch transistors in the fingerprint identification circuits of a same row are connected to a same initialization control signal line; and the display substrate further comprises:

a first gate driving circuit on the base substrate; wherein the first gate driving circuit comprises: a plurality of cascaded first shift register units; the first shift register units are connected to the fingerprint scanning signal lines in a one-to-one correspondence;

a signal output terminal of an Nth first shift register unit is connected to an Nth fingerprint scanning signal line and an (N+1)th initialization control signal line; N≥1.

13. The display device of claim 9, wherein the pixel driving sub-circuit and the control sub-circuit each comprise a thin film transistor; the thin film transistor is a top gate thin film transistor;

a light-shielding layer is on a side of the thin film transistor proximal to the base substrate, and an orthographic projection of the light-shielding layer on the base substrate covers an orthographic projection of an active layer of the thin film transistor on the base substrate; and the detection electrode and the light-shielding layer are in a same layer and are made of a same material.

14. The display device of claim 13, wherein the control sub-circuit at least comprises: a read switch transistor and an initialization switch transistor;

a control electrode of the read switch transistor is connected to a fingerprint scanning signal line, a first electrode of the read switch transistor is connected to the sensing signal line, and a second electrode of the read switch transistor is connected to the detection electrode; and a control electrode of the initialization switch transistor is connected to an initialization control signal line, a first electrode of the initialization switch transistor is connected to the driving signal line, and a second electrode of the initialization switch transistor is connected to the detection electrode.

15. The display device of claim 14, wherein the pixel driving sub-circuit comprises a driving transistor and a storage capacitor; a control electrode of the driving transistor is used as a first plate of the storage capacitor; a second plate of the storage capacitor is on a side of the first plate distal to the base substrate; a second gate insulating layer is between the second plate and the first plate; a first gate insulating layer is between the control electrode and the active layer of the driving transistor; each layer of the driving transistor and corresponding layer of the read switch transistor are in a same layer and are made of the same material;

the detection electrode is on a side of the read switch transistor proximal to the base substrate, a buffer layer is between a layer where an active layer of the read switch transistor is located and a layer where the detection electrode is located; a transition electrode is also provided in a layer where the second plate is located, and is made of a same material as the second plate;

a second electrode of the read switch transistor is connected to the transition electrode through a via extending through the interlayer insulating layer; the transition electrode is connected to the detection electrode through a via extending through the first gate insulating layer, the second gate insulating layer and the buffer layer.

16. The display device of claim 14, wherein the pixel driving sub-circuit comprises a driving transistor; and each layer of the driving transistor and a corresponding layer of the read switch transistor are in a same layer and are made of a same material;

a planarization layer is between a layer where a source and a drain of the driving transistor are located and a layer where the anode of the light-emitting device is located; a pixel defining layer is on a side, distal to the base substrate, of the layer where the anode of the light-emitting device is located;

the detection electrode and a cathode of the light-emitting device are in a same layer, the anode layer of the light-emitting device is also provided with a transition electrode which is made of the same material as the detection electrode; the transition electrode is connected to the second electrode of the read switch transistor through a via extending through the planarization layer; the detection electrode is connected to the transition electrode through a via extending through the pixel defining layer.

17. The display device of claim 14, wherein the plurality of fingerprint identification circuits are arranged in an array, and control electrodes of read switch transistors in the fingerprint identification circuits of a same row are connected to a same fingerprint scanning line; control electrodes of initialization switch transistors in the fingerprint identification circuits of a same row are connected to a same initialization control signal line; and the display substrate further comprises:

a first gate driving circuit on the base substrate; wherein the first gate driving circuit comprises: a plurality of cascaded first shift register units; the first shift register units are connected to the fingerprint scanning signal lines in a one-to-one correspondence;

a signal output terminal of an Nth first shift register unit is connected to an Nth fingerprint scanning signal line and an (N+1)th initialization control signal line; N≥1.

18. The display device of claim 14, wherein the plurality of fingerprint identification circuits are arranged in an array, and first electrodes of read switch transistors in the fingerprint identification circuits of a same column are connected to a same sensing signal line; and first electrodes of initialization switch transistors in the fingerprint identification circuits of a same row are connected to a same driving signal line.

19. The display device of claim 9, wherein the plurality of pixel circuits are arranged in an array, and the pixel circuits and the fingerprint identification circuits are alternately arranged in a row direction or a column direction.

\* \* \* \* \*